(12) United States Patent
Su et al.

(10) Patent No.: US 11,342,431 B2
(45) Date of Patent: May 24, 2022

(54) THIN FILM TRANSISTOR AND MANUFACTURING METHOD THEREOF, ARRAY SUBSTRATE AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Tongshang Su, Beijing (CN); Dongfang Wang, Beijing (CN); Qinghe Wang, Beijing (CN); Ning Liu, Beijing (CN); Yongchao Huang, Beijing (CN); Yu Ji, Beijing (CN); Zheng Wang, Beijing (CN); Liangchen Yan, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/767,247

(22) PCT Filed: Dec. 18, 2019

(86) PCT No.: PCT/CN2019/126289
§ 371 (c)(1),
(2) Date: May 27, 2020

(87) PCT Pub. No.: WO2020/173187
PCT Pub. Date: Sep. 3, 2020

(65) Prior Publication Data
US 2021/0167181 A1    Jun. 3, 2021

(30) Foreign Application Priority Data
Feb. 27, 2019 (CN) .......................... 201910148181.5

(51) Int. Cl.
*H01L 29/423* (2006.01)
*H01L 29/786* (2006.01)
(Continued)

(52) U.S. Cl.
CPC ...... *H01L 29/42384* (2013.01); *H01L 29/401* (2013.01); *H01L 29/4908* (2013.01);
(Continued)

(58) Field of Classification Search
CPC ............. H01L 29/42384; H01L 29/401; H01L 29/4908; H01L 29/66757; H01L 29/66969;
(Continued)

(56) References Cited

U.S. PATENT DOCUMENTS 6,225,150 B1 * 5/2001 Lee .................. H01L 29/78621
438/153
6,576,926 B1 * 6/2003 Yamazaki ........... H01L 27/3248
257/66
(Continued)

FOREIGN PATENT DOCUMENTS

CN        1598677 A      3/2005
CN      104681628 A      6/2015
(Continued)

OTHER PUBLICATIONS

First Office Action, including Search Report, for Chinese Patent Application No. 201910148181.5, dated Apr. 24, 2020, 25 pages.

*Primary Examiner* — Tong-Ho Kim
(74) *Attorney, Agent, or Firm* — Westman, Champlin & Koehler, P.A.

(57) ABSTRACT

A thin film transistor and a manufacturing method thereof, an array substrate and a display device are provided. The thin film transistor is formed on a substrate and includes: an active layer on the substrate, the active layer including a
(Continued)

source region, a drain region, and a channel region between the source region and the drain region; a first gate electrode on a side of the active layer away from the substrate; and a second gate electrode on a side of the first gate electrode away from the substrate, wherein a thickness of the first gate electrode is smaller than a thickness of the second gate electrode.

16 Claims, 12 Drawing Sheets

(51) Int. Cl.
*H01L 29/49* (2006.01)
*H01L 29/66* (2006.01)
*H01L 29/40* (2006.01)
H01L 21/223 (2006.01)
H01L 21/3213 (2006.01)
H01L 21/383 (2006.01)
H01L 21/4763 (2006.01)
H01L 27/12 (2006.01)

(52) U.S. Cl.
CPC .. *H01L 29/66757* (2013.01); *H01L 29/66969* (2013.01); *H01L 29/78696* (2013.01); *H01L 21/2236* (2013.01); *H01L 21/32134* (2013.01); *H01L 21/32139* (2013.01); *H01L 21/383* (2013.01); *H01L 21/47635* (2013.01); *H01L 27/1214* (2013.01); *H01L 27/1225* (2013.01); *H01L 29/78633* (2013.01)

(58) Field of Classification Search
CPC ......... H01L 29/78696; H01L 29/78633; H01L 21/2236; H01L 21/32134; H01L 21/32139; H01L 21/383; H01L 21/47635; H01L 27/1214; H01L 27/1225

USPC .......................................................... 257/43
See application file for complete search history.

(56) References Cited

U.S. PATENT DOCUMENTS

| | | | |
|---|---|---|---|
| 7,218,361 | B2 | 5/2007 | Yamazaki et al. |
| 7,486,344 | B2 | 2/2009 | Yamazaki et al. |
| 8,890,156 | B2 | 11/2014 | Yeh et al. |
| 9,653,487 | B2 | 5/2017 | Yamazaki et al. |
| 9,673,333 | B2 | 6/2017 | Liu et al. |
| 10,283,529 | B2 | 5/2019 | Choi et al. |
| 10,374,024 | B2 | 8/2019 | Wang |
| 2001/0052950 | A1* | 12/2001 | Yamazaki ........... H01L 27/1214 349/43 |
| 2006/0030089 | A1 | 2/2006 | Chung |
| 2007/0138480 | A1 | 6/2007 | Yamazaki et al. |
| 2017/0018652 | A1 | 1/2017 | Liu et al. |
| 2017/0170251 | A1* | 6/2017 | Moon ................. H01L 29/7869 |
| 2017/0179164 | A1 | 6/2017 | Choi et al. |
| 2018/0083047 | A1* | 3/2018 | Wang .................... G02F 1/1368 |
| 2018/0083142 | A1 | 3/2018 | Chi |
| 2019/0035825 | A1* | 1/2019 | Huang ............... H01L 27/1259 |
| 2019/0165072 | A1 | 5/2019 | Wang |
| 2020/0287052 | A1 | 9/2020 | Qu et al. |

FOREIGN PATENT DOCUMENTS

| | | |
|---|---|---|
| CN | 105789117 A | 7/2016 |
| CN | 106684155 A | 5/2017 |
| CN | 106898551 A | 6/2017 |
| CN | 107818988 A | 3/2018 |
| CN | 109920856 A | 6/2019 |

* cited by examiner

THIN FILM TRANSISTOR AND MANUFACTURING METHOD THEREOF, ARRAY SUBSTRATE AND DISPLAY DEVICE

CROSS-REFERENCE TO RELATED APPLICATION

This application is a Section 371 National Stage Application of International Application No. PCT/CN2019/126289, filed on Dec. 18, 2019, entitled "THIN FILM TRANSISTOR AND MANUFACTURING METHOD THEREOF, ARRAY SUBSTRATE AND DISPLAY DEVICE", which claims priority to Chinese Patent Application No. 201910148181.5 filed on Feb. 27, 2019 in the National Intellectual Property Administration of China, the disclosures of which are incorporated herein by reference in their entireties.

TECHNICAL FIELD

Embodiments of the present disclosure relate to the technical field of semiconductors, and in particular, to a thin film transistor and a manufacturing method thereof, an array substrate including the thin film transistor, and a display device.

BACKGROUND

Thin film transistors (TFTs) are used as switching devices and driving devices in display devices such as liquid crystal display devices (LCDs) and organic light emitting display devices (OLEDs). A performance of the thin film transistors may be affected by a material and a state of a channel through which charge carriers travel.

A top-gate electrode thin film transistor has better performances than a bottom-gate electrode thin film transistor, for example, it has a smaller parasitic capacitance, a larger on-state current, a smaller sub-threshold swing, a higher stability, and other advantages. Therefore, the top-gate electrode thin film transistor has been more and more widely used. However, in an existing manufacturing method of the top-gate electrode thin film transistor, a length of a channel of the transistor is significantly shortened, resulting in a short channel effect. The short channel effect will cause a threshold voltage of the thin film transistor to drift negatively, thereby affecting the stability of the thin film transistor, and then affecting the display quality.

SUMMARY

In one aspect, it is provided a thin film transistor formed on a substrate, wherein the thin film transistor includes: an active layer on the substrate, the active layer including a source region, a drain region, and a channel region between the source region and the drain region; a first gate electrode on a side of the active layer away from the substrate; and a second gate electrode on a side of the first gate electrode away from the substrate, wherein a thickness of the first gate electrode is smaller than a thickness of the second gate electrode.

Optionally, an orthographic projection of the first gate electrode on the substrate covers an orthographic projection of the second gate electrode on the substrate.

Optionally, an orthographic projection of the first gate electrode on the substrate completely coincides with an orthographic projection of the channel region on the substrate.

Optionally, an orthographic projection of any one of the first gate electrode and the second gate electrode on the substrate does not overlap with an orthographic projection of any one of the source region and the drain region on the substrate.

Optionally, a surface of the first gate electrode close to the second gate electrode is in direct contact with a surface of the second gate electrode close to the first gate electrode.

Optionally, the first gate electrode includes a first material which is suitable to be etched with a first etching solution, the second gate electrode includes a second material which is suitable to be etched with a second etching solution, and the first etching solution is different from the second etching solution.

Optionally, the first gate electrode includes a first material which is suitable to be etched with a third etching solution, the second gate electrode includes a second material which is suitable to be etched with the third etching solution, and an etching rate, at which the first material is etched with the third etching solution, is different from an etching rate, at which the second material is etched with the third etching solution.

Optionally, the first gate electrode includes a metal oxide conductive material, and the second gate electrode includes a metal conductive material.

Optionally, the first gate electrode includes a first metal material, and the second gate electrode includes a second metal material different from the first metal material.

Optionally, a ratio of the thickness of the first gate electrode to the thickness of the second gate electrode is in a range of 1/60 to 1/8.

Optionally, the thickness of the first gate electrode is in a range of 150 Å to 1500 Å.

Optionally, a conductivity of any one of the source region and the drain region is greater than a conductivity of the channel region.

Optionally, a material of the active layer includes one selected from an oxide semiconductor material, a polycrystalline silicon semiconductor material, or an amorphous silicon semiconductor material.

Optionally, the thin film transistor further includes a light shielding layer between the substrate and the active layer, wherein an orthographic projection of the light shielding layer on the substrate covers an orthographic projection of the channel region on the substrate.

In another aspect, an array substrate is provided, including the thin film transistor as mentioned above.

In a further aspect, a display device is provided, including the array substrate as mentioned above.

In another further aspect, a method of manufacturing a thin film transistor is provided, including:

forming an active layer on a substrate;

forming a first gate material layer and a second gate material layer in sequence on the substrate, a thickness of the first gate material layer being smaller than a thickness of the second gate material layer;

performing a patterning process on the first gate material layer and the second gate material layer to form a first gate electrode and a second gate electrode, respectively; and performing a conductorization treatment on the active layer with using the first gate electrode as a mask, so that the active layer includes a source region, a drain region, and a channel region between the source region and the drain region.

Optionally, the step of performing a patterning process on the first gate material layer and the second gate material layer to form a first gate electrode and a second gate electrode, respectively includes:

forming a photoresist layer on the second gate material layer;

forming a photoresist pattern through exposure and development processes;

etching the second gate material layer with a second etching solution to form the second gate electrode; and etching the first gate material layer with a first etching solution different from the second etching solution, to form the first gate electrode.

Optionally, the step of performing a patterning process on the first gate material layer and the second gate material layer to form a first gate electrode and a second gate electrode, respectively includes:

forming a photoresist layer on the second gate material layer;

forming a photoresist pattern through exposure and development processes; and etching both the second gate material layer and the first gate material layer with a third etching solution to form the first gate electrode and the second gate electrode, wherein an etching rate, at which the first gate material layer is etched with the third etching solution, is different from an etching rate, at which the second gate material layer is etched with the third etching solution.

Optionally, an orthographic projection of the first gate electrode on the substrate covers an orthographic projection of the second gate electrode on the substrate.

Optionally, the step of performing a conductorization treatment on the active layer with using the first gate electrode as a mask so that the active layer includes a source region, a drain region, and a channel region between the source region and the drain region includes:

performing the conductorization treatment on portions of the active layer which are not covered by the first gate electrode, so that the portions of the active layer which are not covered by the first gate electrode form the source region and the drain region, respectively, and a portion of the active layer which is covered by the first gate electrode forms the channel region.

Optionally, the orthographic projection of the first gate electrode on the substrate completely coincides with an orthographic projection of the channel region on the substrate.

Optionally, a ratio of the thickness of the first gate material layer to the thickness of the second gate material layer is in a range of 1/60 to 1/8.

Optionally, the thickness of the first gate material layer is in a range of 150 Å to 1500 Å.

BRIEF DESCRIPTION OF THE DRAWINGS

Through the following description of the present disclosure with reference to accompanying drawings, other objects and advantages of the present disclosure will be apparent and may help a comprehensive understanding of the present disclosure.

Figure 1A:
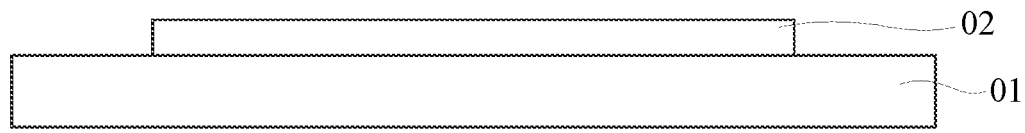
FIG. 1A to FIG. 1H schematically show cross-sectional views of structures formed after main steps of a method of manufacturing a thin film transistor according to some exemplary embodiments of the present disclosure are performed.

It should be noted that, for the sake of clarity, in the drawings used to describe the embodiments of the present disclosure, sizes of layers, structures, or regions may be enlarged or reduced, that is, these drawings are not drawn to actual scale.

DETAILED DESCRIPTION OF EMBODIMENTS

Technical solutions of the present disclosure will be further specifically described below through embodiments with reference to accompanying drawings. In the specification, the same or similar reference numerals indicate the same or similar components. The following description of the embodiments of the present disclosure with reference to the accompanying drawings is intended to explain the general inventive concept of the present disclosure, and should not be construed as limiting the present disclosure.

In addition, in the following detailed description, for ease of explanation, many specific details are set forth to provide a comprehensive understanding of the embodiments of the present disclosure. Obviously, however, one or more embodiments may be implemented without these specific details.

It should be understood that, although terms such as first, second and the like may be used herein to describe different elements, these elements should not be limited by these terms. These terms are only used to distinguish one element from another element. For example, without departing from the scope of example embodiments, the first element may be named as the second element, and similarly, the second element may be named as the first element. An expression "and/or" as used herein includes any and all combinations of one or more related listed items.

It should be understood that when an element or layer is referred to as being "formed on" another element or layer, the element or layer may be directly or indirectly formed on another element or layer. That is, for example, there may be intermediate elements or intermediate layers. In contrast, when an element or layer is referred to as being "formed directly on" another element or layer, there are no intermediate elements or layers. Other words (for example, "between" and "directly between", "adjacent" and "directly adjacent") which are used to describe a relationship between elements or layers should be interpreted in a similar manner.

The terminologies used herein are intended to only describe particular embodiments, and are not intended to limit example embodiments. As used herein, unless the context clearly indicates otherwise, a singular form is also intended to include a plural form. It will also be understood that when terms "comprising" and/or "including" are used herein, they indicate that there are listed features, entireties, steps, operations, elements and/or components, but they does not exclude a presence or an addition of one or more of other features, entireties, steps, operations, elements, components, and/or combinations thereof.

In this context, unless otherwise specified, an expression "thickness" refers to a dimension of a layer or component in a direction perpendicular to an upper surface of a substrate, the upper surface of the substrate being a surface facing the user in use.

In this context, an expression "using a gate electrode as a mask" or "using a first gate electrode as a mask" means that the gate electrode or the first gate electrode acts as a mask during a conductorization treatment, so that portions of an active layer that are not covered by the gate electrode or the first gate electrode is conductorized, and a portion of the active layer that is covered by the gate electrode or the first gate electrode is not conductorized due to a shielding of the gate electrode or the first gate electrode.

In this context, terms such as "conductorize", "conductorized", "conductorization" or "conductorization treatment" may be meant to "make at least a portion of a layer (i.e. semiconductor layer or active layer) conductive.

FIG. 1A to FIG. 1H schematically show cross-sectional views of structures formed after main steps of a method of manufacturing a thin film transistor according to some exemplary embodiments of the present disclosure are performed. Hereinafter, the method of manufacturing the thin film transistor according to some exemplary embodiments of the present disclosure will be described in detail with reference to FIG. 1A to FIG. 1H.

In step S101, referring to FIG. 1A, an active layer 02 is formed on a substrate 01. Specifically, a semiconductor material layer may be deposited on the substrate 01, and then the semiconductor material layer is patterned through a patterning process to form a pattern of the semiconductor material layer, that is, the active layer 02 shown in FIG. 1A.

For example, a material of the active layer 02 may include an oxide semiconductor material, a polycrystalline silicon semiconductor material (for example, low-temperature polycrystalline silicon), or an amorphous silicon semiconductor material.

Figure 1B:
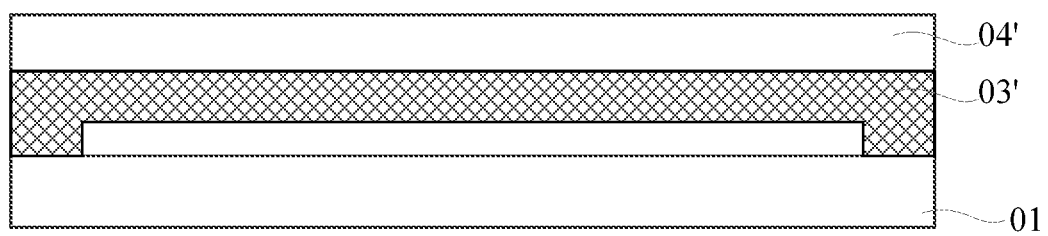

In step S102, referring to FIG. 1B, a first insulating material layer 03' and a gate material layer 04' are formed on the substrate 01.

For example, the first insulating material layer 03' may include an insulating material such as silicon nitride or silicon oxide.

For example, the gate material layer 04' may include conductive materials such as ITO and IZO.

Figure 1C:
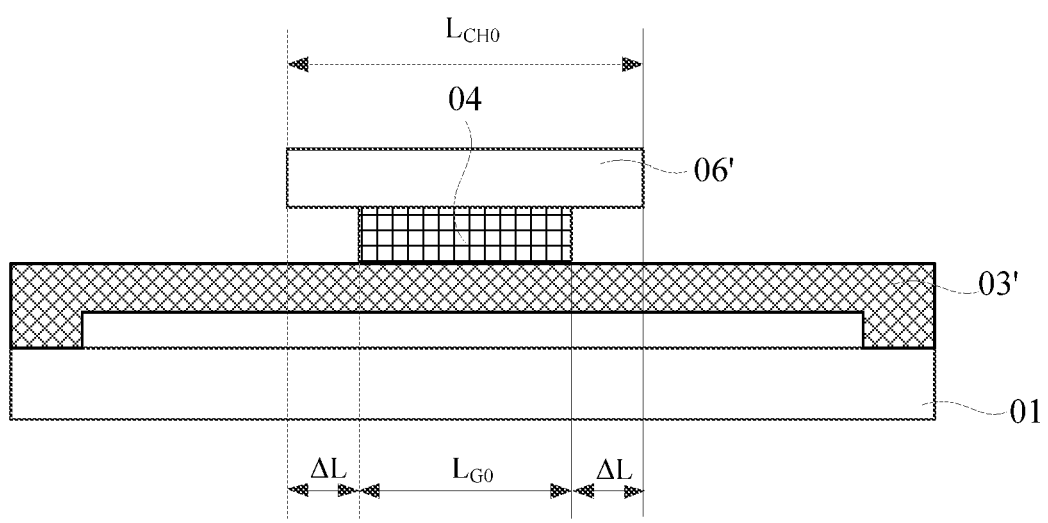

In step S103, referring to FIG. 1C, a patterning process is performed on the gate material layer 04' to form the gate electrode 04.

Specifically, a photoresist layer may be formed on the gate material layer 04', and then a photoresist pattern 06' may be formed through exposure and development processes. Next, the gate material layer 04' is etched. For example, the gate material layer 04' may be etched by using a wet etching process to form the gate electrode 04.

Those skilled in the art should understand that wet etching is isotropic, that is, in the process of wet etching, a material layer is laterally etched while the material layer is etched vertically, and a width of a lateral etching is proportional to a depth of a vertical etching. Generally, the width of the lateral etching is directly proportional to the depth of the vertical etching. Specifically, referring to FIG. 1C, during a process of etching the gate material layer 04' by using a wet etching process, the gate material layer 04' is not only etched in a vertical direction in FIG. 1C (i.e., a direction perpendicular to an upper surface of the substrate 1), but also etched in a horizontal direction in FIG. 1C (i.e., a direction parallel to the upper surface of the substrate 1). In this way, as shown in FIG. 1C, the formed gate electrode 04 will be recessed with respect to the photoresist pattern 06', that is, a length $L_{G0}$ of the gate electrode 04 is smaller than a length $L_{CH0}$ of the photoresist pattern 06', and an orthographic projection of the gate electrode 04 on the substrate 01 falls within an orthographic projection of the photoresist pattern 06' on the substrate 01. As shown in FIG. 1C, the gate electrode 04 is recessed with respect to the photoresist pattern 06' on both sides thereof. For convenience of description, a size of a recess of the gate electrode 04 with respect to the photoresist pattern 06' on one side thereof is labelled as ΔL, this ΔL may be referred to as an etching bias. A relationship between the length $L_{G0}$ of the gate electrode 04 and the length $L_{CH0}$ of the photoresist pattern 06' may be expressed as follows:

$$L_{CH0}=L_{G0}+2*\Delta L,$$

In the above relationship, 2*ΔL is a bias (also referred to as CD bias) between the length of the photoresist pattern 06' and the length of the gate electrode 04.

In order to make the formed gate electrode have good conductivity, the gate material layer 04' needs to be formed relatively thick. As a result, when the gate material layer 04' is etched, as the etching is isotropic, the bias (CD bias) between the length of the photoresist pattern 06' and the length of the gate electrode 04 is relatively large. In one example, a thickness of the gate material layer 04' may be set to 3000~9000 Å, for example, 4000 Å. In this case, through several experiments, the inventor found that the bias (CD bias) between the length of the photoresist pattern 06' and the length of the gate electrode 04 may be as large as 1.5~2.5 μm.

Figure 1D:
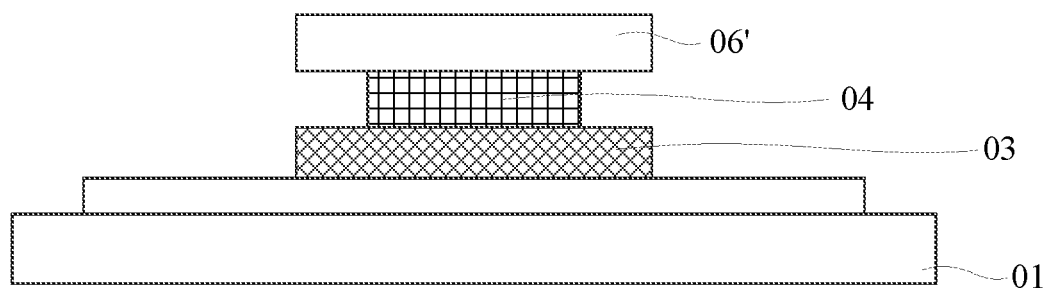

In step S104, referring to FIG. 1D, a patterning process is performed on the first insulating material layer 03' to form a pattern of the first insulating material layer 03', that is, the gate insulating layer 03 is formed. For example, the gate insulating layer 03 may be formed by using a dry etching process.

Figure 1E:
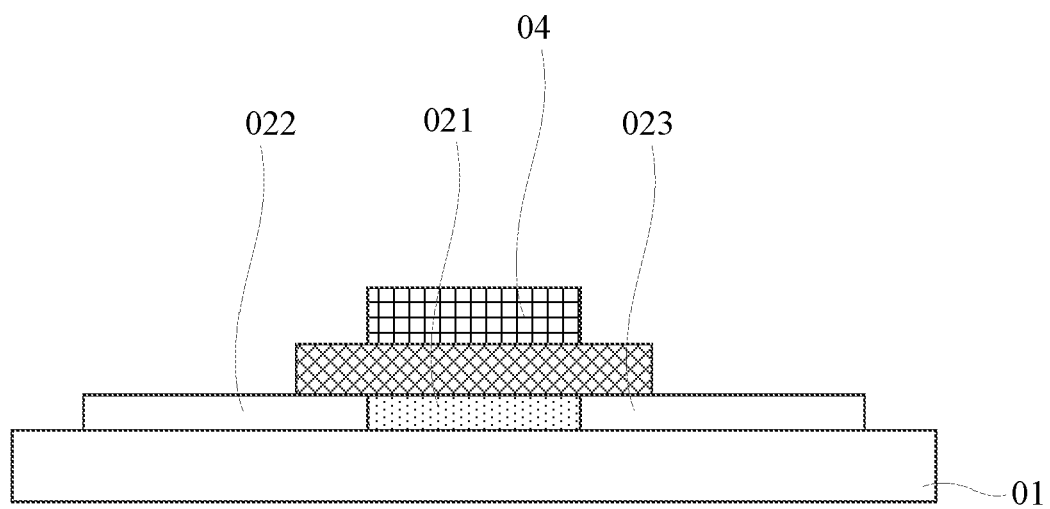

In step S105, referring to FIG. 1E, portions of the active layer 02 on both sides of the gate electrode 04 may be conductorized to form a source region 022 and a drain region 023. For example, a plasma containing He may be used to make the portions of the active layer 02 on both sides of the gate electrode 04 conductive, so that the active layer 02 includes the source region 022, a channel region 021, and the drain region 023. A conductivity of each of the source region 022 and the drain region 023 which have both been conductorized is greater than a conductivity of the channel region 021.

As shown in FIG. 1E, the channel region 021 is a portion of the active layer 02 which is covered by the gate electrode 04, that is, an orthographic projection of the gate electrode 04 on the substrate 01 covers an orthographic projection of the channel region 021 on the substrate 01. Optionally, the orthographic projection of the gate electrode 04 on the substrate 01 completely coincides with an orthographic projection of the channel region 021 on the substrate 01.

In this step, the gate electrode 04 is used as a mask to perform the conductorization treatment. The portion of the active layer 02 which is covered by the gate electrode 04 is not conductorized, that is, it is still a semiconductor. The portions of the active layer 02 which are not covered by the gate electrode 04 are conductorized, thereby forming the source region and the drain region with greater conductivity.

The inventor found through research that, as described above, when the gate material layer 04' is etched, as the etching is isotropic, the bias (CD bias) between the length of the photoresist pattern 06' and the length of the gate electrode 04 is relatively large, that is, the length of the formed gate electrode 04 is shorter than a designed length of the gate electrode. In this way, when the conductorization treatment is performed with using the gate electrode 04 as a mask, a length of the portion of the active layer 02 which is covered by the gate electrode 04 is accordingly short, so the length of the formed channel region 021 is shorter than a designed length of the channel region. As the length of the formed channel region is short, a threshold voltage drifts negatively, which ultimately affects the uniformity of threshold voltages Vth of the thin film transistors, thereby reducing the display quality of the display panel.

It should be noted that the "designed length" here refers to a theoretical length of the channel region which is calculated when designing the thin film transistor. Those skilled in the art should understand that, in an actual manufacturing process of the thin film transistor, there may be a bias between the length of the actually manufactured channel region and the designed length of the channel region due to limitations of the actual manufacturing process.

According to an example of the present disclosure, the material of the gate material layer 04' is ITO, the thickness of the gate material layer 04' is 4000 Å, and the bias (CD bias) between the length of the photoresist pattern 06' and the length of the gate electrode 04 may be as high as 1.5 to 2.5 μm. Accordingly, the length of the formed channel region 021 is shorter than the designed length of the channel region by 1.5 to 2.5 μm. Therefore, the length of the formed channel region is significantly reduced, resulting in a negative drift of the threshold voltage. As a result, the uniformity of threshold voltages Vth of the thin film transistors is ultimately affected, thereby reducing the display quality of the display panel. Moreover, for high-resolution display products, the length of the channel region of the thin film transistor is generally required to be relatively short, for example, the length of the channel region may be required to be 2~3 μm. If the bias of the length of the formed channel region is as high as 1.5 to 2.5 μm, the performance of thin film transistor may be greatly adversely affected, so it is not conducive to realizing high-resolution display products.

Optionally, the method of manufacturing the thin film transistor according to the exemplary embodiments of the present disclosure may further include the following steps.

Figure 1F:
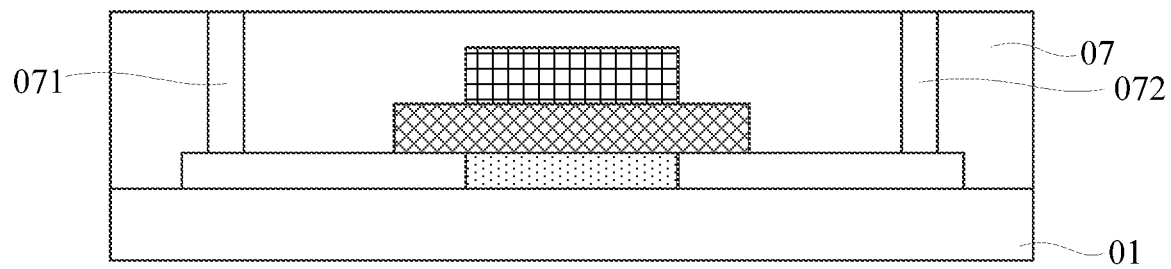

In step S106, referring to FIG. 1F, an interlayer insulating layer 07 covering the active layer 02, the gate insulating layer 03, and the gate electrode 04 may be deposited on the substrate 01, and via holes 071, 072 are formed in the interlayer insulating layer 07.

Figure 1G:
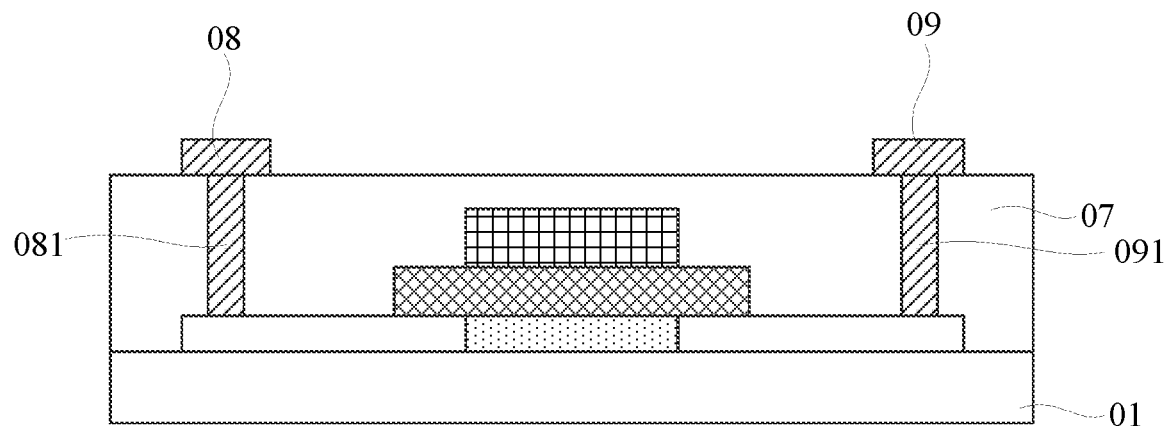

In step S107, referring to FIG. 1G, a source-drain metal layer may be deposited on the substrate 01, so that conductive plugs 081, 091 are respectively formed in the via holes 071, 072 of the interlayer insulating layer 07, and a source electrode 08 and a drain electrode 09 are respectively formed on the interlayer insulating layer 07. As shown in FIG. 1G, the source electrode 08 is electrically connected to the source region 022 through the conductive plug 081, and the drain electrode 09 is electrically connected to the drain region 023 through the conductive plug 091.

Figure 1H:
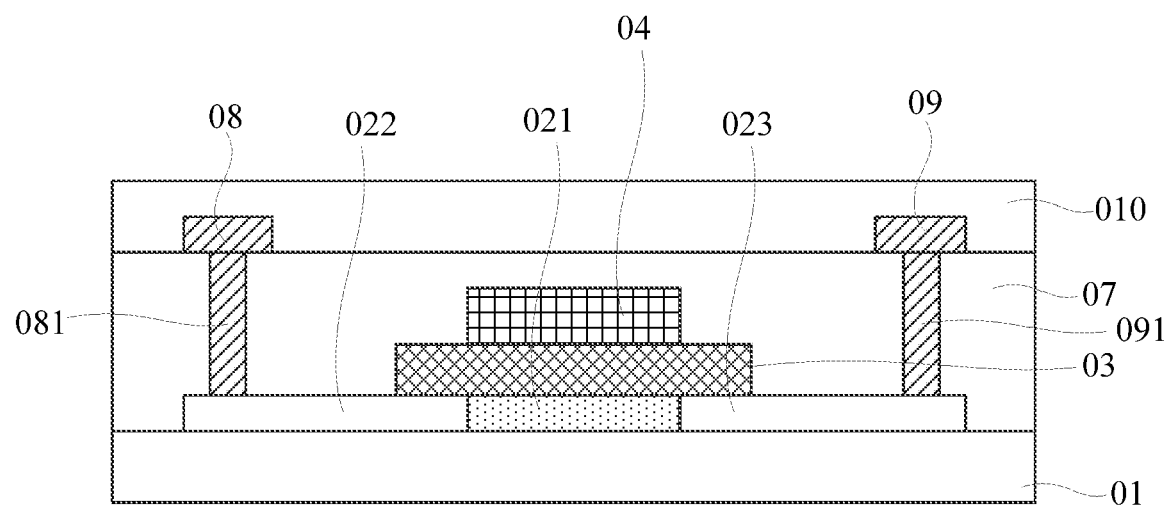

In step S108, referring to FIG. 1H, a passivation layer 010 covering the interlayer insulating layer 07, the source electrode 08, and the drain electrode 09 may be formed on the substrate 01.

Figure 2:
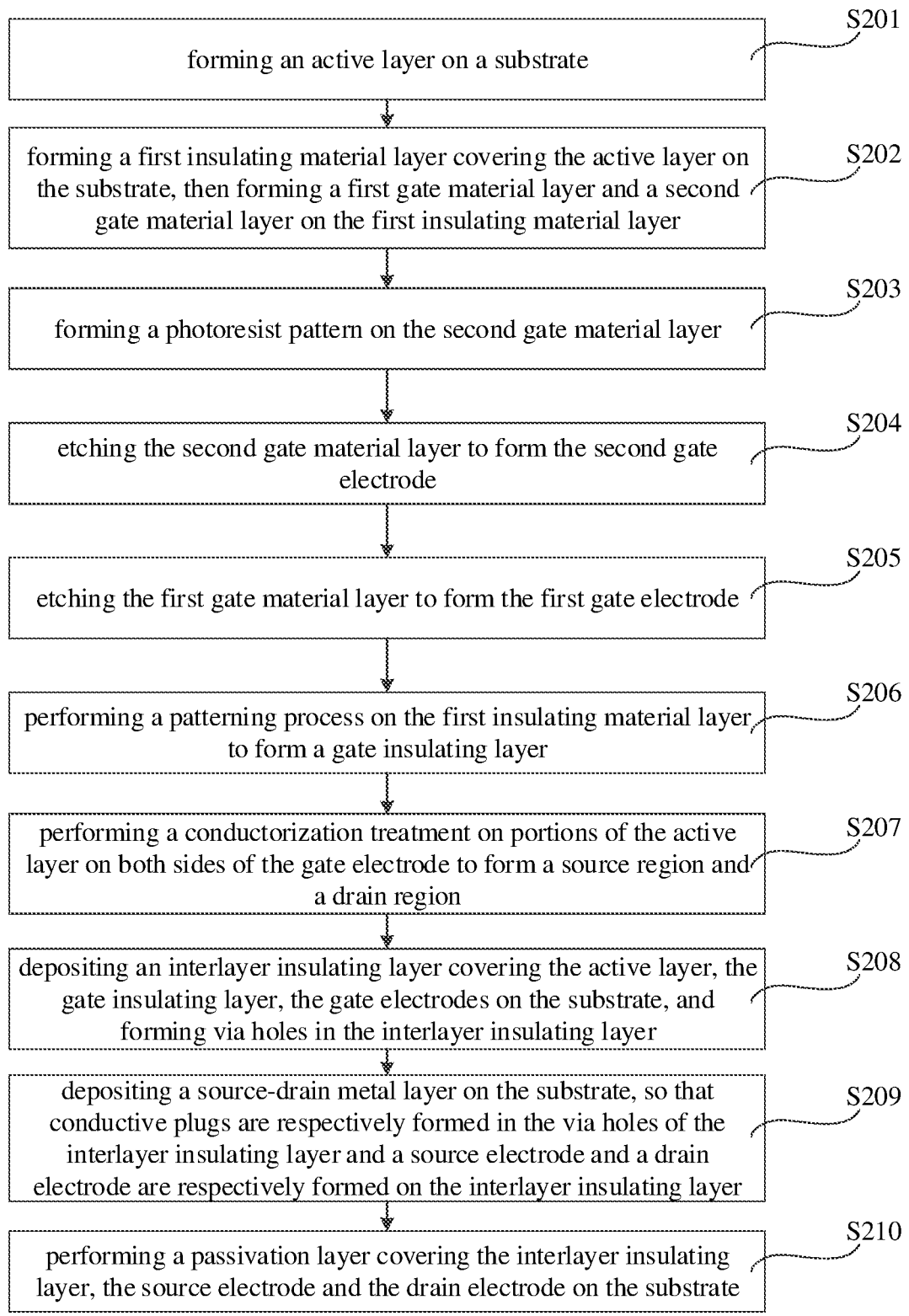
FIG. 2 is a flowchart of a method of manufacturing a thin film transistor according to other exemplary embodiments of the present disclosure.

FIG. 2 is a flowchart of a method of manufacturing a thin film transistor according to other exemplary embodiments of the present disclosure, and FIG. 3A to FIG. 3J schematically illustrate cross-sectional views of structures formed after main steps of a method of manufacturing a thin film transistor according to other exemplary embodiments of the present disclosure are performed. Hereinafter, the method of manufacturing the thin film transistor according to other exemplary embodiments of the present disclosure will be described in detail with reference to FIGS. 2, 3A to 3J.

Figure 3A:
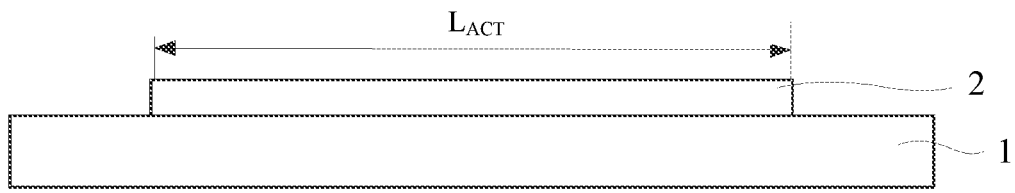
FIG. 3A to FIG. 3J schematically illustrate cross-sectional views of structures formed after main steps of a method of manufacturing a thin film transistor according to other exemplary embodiments of the present disclosure are performed.

In step S201, referring to FIG. 3A, an active layer 2 is formed on a substrate 1. Specifically, a semiconductor material layer may be deposited on the substrate 1 and then processed through a patterning process to form a pattern of the semiconductor material layer, that is, the active layer 2 shown in FIG. 3A. For convenience of description, the length of the active layer 2 shown in FIG. 3A is labeled as $L_{ACT}$.

For example, the substrate 1 may be a rigid substrate or a flexible substrate, such as a glass substrate or a plastic substrate.

For example, the material of the active layer 2 may include an oxide semiconductor material, a polycrystalline silicon semiconductor material (e.g., low-temperature polycrystalline silicon), or an amorphous silicon semiconductor material.

Optionally, the active layer 2 may be formed of an oxide semiconductor. For example, the active layer 2 may include a ZnO-based oxide layer. In this case, the active layer 2 may further contain a group III element such as In or Ga, a group IV element such as Sn, a combination thereof, or other elements. For another example, the active layer 2 may include a Cu oxide layer ($CuBO_2$ layer, $CuAlO_2$ layer, $CuGaO_2$ layer, $CuInO_2$ layer, etc.), a Ni oxide layer, a Ni oxide layer doped with Ti, a ZnO-based oxide layer doped with at least one of group I elements, Group II elements or Group V elements, a ZnO-based oxide layer doped with Ag, a PbS layer, a LaCuOS layer, or a LaCuOSe layer. As an example, the active layer 2 may include indium gallium zinc oxide (IGZO) or indium tin zinc oxide (ITZO).

Figure 3B:
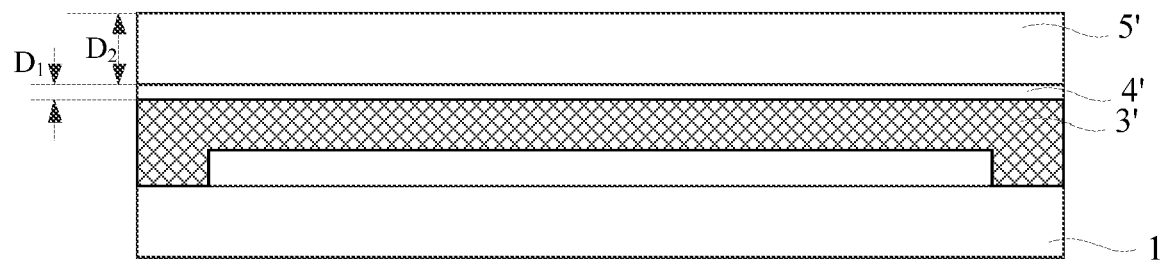

In step S202, referring to FIG. 3B, a first insulating material layer 3' covering the active layer 2 is formed on the substrate 1, then a first gate material layer 4' and a second gate material layer 5' are formed on the first insulating material layer 3'.

As shown in FIG. 3B, the first insulating material layer 3', the first gate material layer 4' and the second gate material layer 5' may be deposited on the substrate 1 in sequence, and a thickness of the first gate material layer 4' is smaller than a thickness of the second gate material layer 5'. In this context, the "thickness" of a layer or component refers to a dimension of the layer or component in a direction perpendicular to an upper surface of the substrate, for example, the thickness of the first gate material layer 4' and the thickness of the second gate material layer 5' refer to the dimensions of the first gate material layer 4' and the second gate material layer 5' in the vertical direction shown in FIG. 3B, respectively. For convenience of description, the thickness of the first gate material layer 4' and the thickness of the second gate material layer 5' are labeled as D1 and D2, respectively.

In one example, the thickness of the first gate material layer 4' may be much smaller than the thickness of the second gate material layer 5', that is, D1<<D2, for example, a ratio of the thickness of the first gate material layer 4' to the thickness of the second gate material layer 5' may be in a range of 1/60 ~1/8. Optionally, the thickness of the first gate material layer 4' may be in a range of 150~1500 Å, such as 150 Å, 200 Å, and the thickness of the second gate material layer 5' may be in a range of 3000~8000 Å, such as 4000 Å.

It should be noted that the inventor found through research that, if the thickness of the first gate material layer 4' is less than 150 Å, a film of the first gate material layer 4' may be uneven when the first gate material layer 4' is formed on the substrate 1, so the thickness of the first gate material layer 4' needs to be greater than or equal to 150 Å. If the thickness of the first gate material layer 4' is greater than 1500 Å, when the first gate material layer 4' is etched, a lateral etching amount of the first gate material layer 4' may be significantly increased as the etching is isotropic.

For example, the first insulating material layer 3' may include an insulating material such as silicon nitride or silicon oxide.

For example, the first gate material layer 4' and the second gate material layer 5' may be formed of conductive materials. In one example, the first gate material layer 4' may include a first material which is suitable to be etched with a first etching solution, and the second gate material layer 5' may include a second material which is suitable to be etched with a second etching solution different from the first etching solution. For example, the first gate material layer 4' may include a metal oxide conductive material, and the second gate material layer 5' may include a metal conductive material. Specifically, the first gate material layer 4' may include materials such as ITO and IZO, and a composition of the first etching solution may include $HNO_3$, $H_2SO_4$ and $CH_3COOH$. The second gate material layer 5' may include materials such as Cu, and a composition of the second etching solution may include $H_2O_2$.

Optionally, the first gate material layer 4' may include a first material which is suitable to be etched with a third etching solution, and the second gate material layer 5' may include a second material which is suitable to be etched with the third etching solution. An etching rate at which the first material is etched with the third etching solution is different from an etching rate at which the second material is etched with the third etching solution. For example, the first gate material layer 4' may include a first metal material, and the second gate material layer 5' may include a second metal material different from the first metal material. Specifically, the first gate material layer 4' may include Al, and the second gate material layer 5' may include Cu. A composition of the third etching solution may include $H_2O_2$, and the third etching solution including $H_2O_2$ has different etching rates on Al and Cu.

In the embodiments of the present disclosure, after the first insulating material layer 3', the first gate material layer 4' and the second gate material layer 5' are formed on the substrate 1, a stacked structure of a thin film transistor may be formed through a patterning process. The stacked structure includes a gate insulating layer 3, a first gate electrode 4 and a second gate electrode 5 stacked on the substrate 1.

Figure 3C:
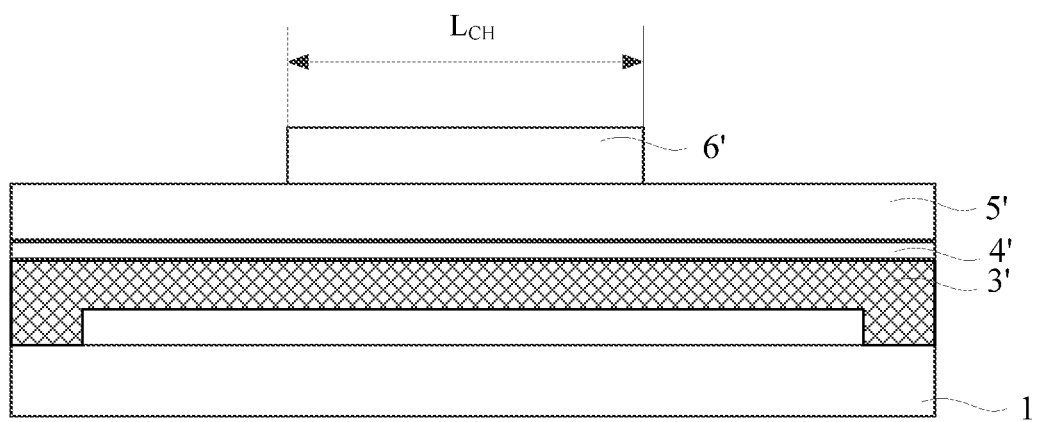

Specifically, in step S203, referring to FIG. 3C, a photoresist pattern 6' is formed on the second gate material layer 5'. For example, a photoresist may be formed on the second gate material layer 5', and then the photoresist pattern 6' may be formed through exposure and development processes.

A position of the photoresist pattern 6' corresponds to a position of the channel region (which will be described in detail below) to be formed in the active layer 2. Specifically, an orthographic projection of the photoresist pattern 6' on the substrate 1 covers an orthographic projection of the channel region to be formed on the substrate 1. As shown in FIG. 3C, the length of the photoresist pattern 6' is labeled as $L_{CH}$, which is equal to the designed length of the channel region to be formed. It should be noted that the "designed length" here refers to a theoretical length of the channel region which is calculated when designing the thin film transistor. Those skilled in the art should understand that, in an actual manufacturing process of the thin film transistor, there may be a bias between the length of the actually manufactured channel region and the designed length of the channel region due to limitations of the actual manufacturing process.

Figure 3D:
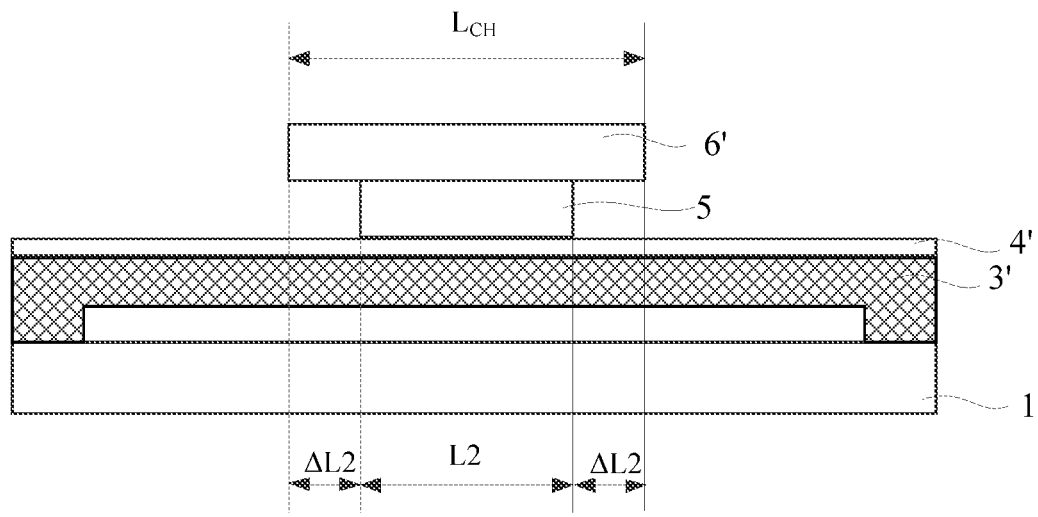

In step S204, referring to FIG. 3D, the second gate material layer 5' is etched to form the second gate electrode 5.

Figure 3E:
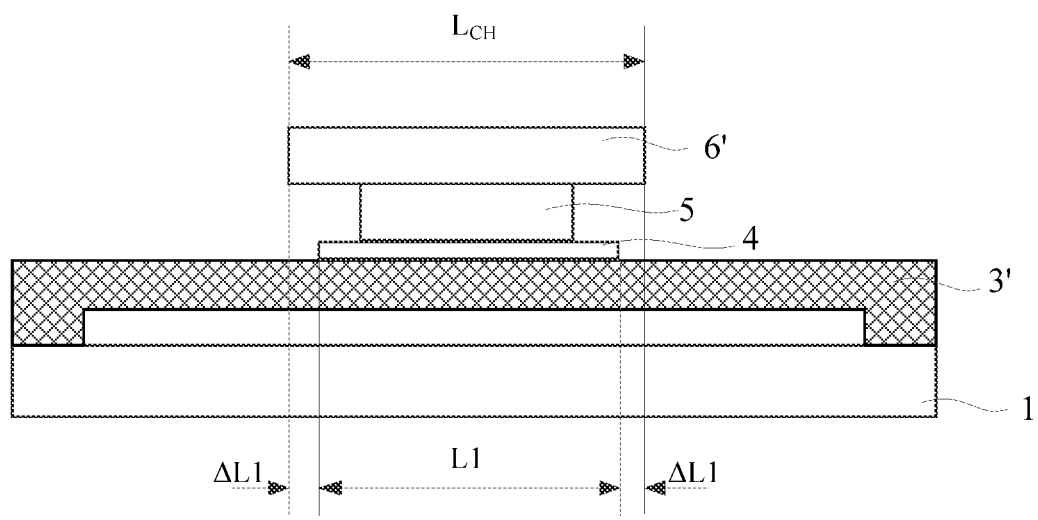

In step S205, referring to FIG. 3E, the first gate material layer 4' is etched to form the first gate electrode 4.

For example, the second gate material layer 5' and the first gate material layer 4' may be etched separately through wet etching processes to form the second gate electrode 5 and the first gate electrode 4, respectively.

For example, the second etching solution may be used to etch the second gate material layer 5', the first etching solution may be used to etch the first gate material layer 4', and the second etching solution may not etch the first gate material layer 4'.

For another example, the third etching solution may be used to etch the second gate material layer 5' and the first gate material layer 4' at the same time, but the third etching solution may etch the second gate material layer 5' and the first gate material layer 4' at different etching rates.

In the embodiments, as described above, as the etching is isotropic, the formed first gate electrode 4 and the formed second gate electrode 5 are both recessed with respect to the photoresist pattern 6', that is, each of the first gate electrode 4 and the second gate electrode 5 will have an etching bias. For convenience of description, the length of the first gate electrode 4 is labeled as L1, the etching bias of the first gate electrode 4 is labeled as ΔL1, the length of the second gate electrode 5 is labeled as L2, and the etching bias of the second gate electrode 5 is labeled as ΔL2, as shown in FIG. 3D and FIG. 3E. Since the thickness of the first gate material layer 4' is smaller than the thickness of the second gate material layer 5', the etching bias ΔL1 of the first gate electrode 4 may be smaller than the etching bias ΔL2 of the second gate electrode 5, that is, ΔL1<ΔL2. Accordingly, the length of the first gate electrode 4 is greater than the length of the second gate electrode 5, that is, L1>L2.

Figure 3F:
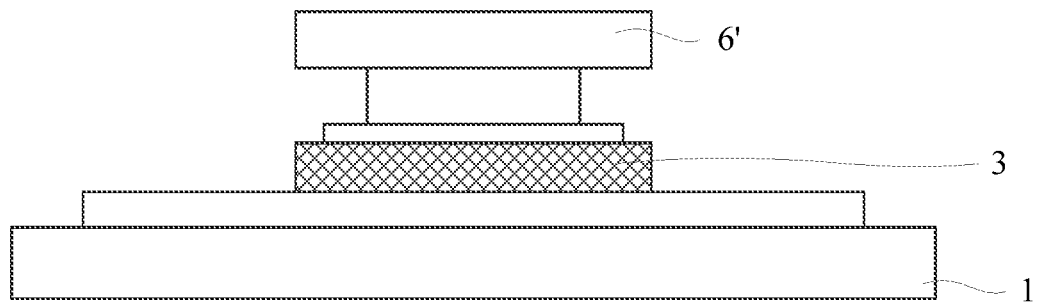

In step S206, referring to FIG. 3F, a patterning process is performed on the first insulating material layer 3' to form a pattern of the first insulating material layer 3', that is, the gate insulating layer 3 is formed. For example, the first insulating material layer 3' may be etched by using a dry etching process to form the gate insulating layer 3.

Figure 3G:
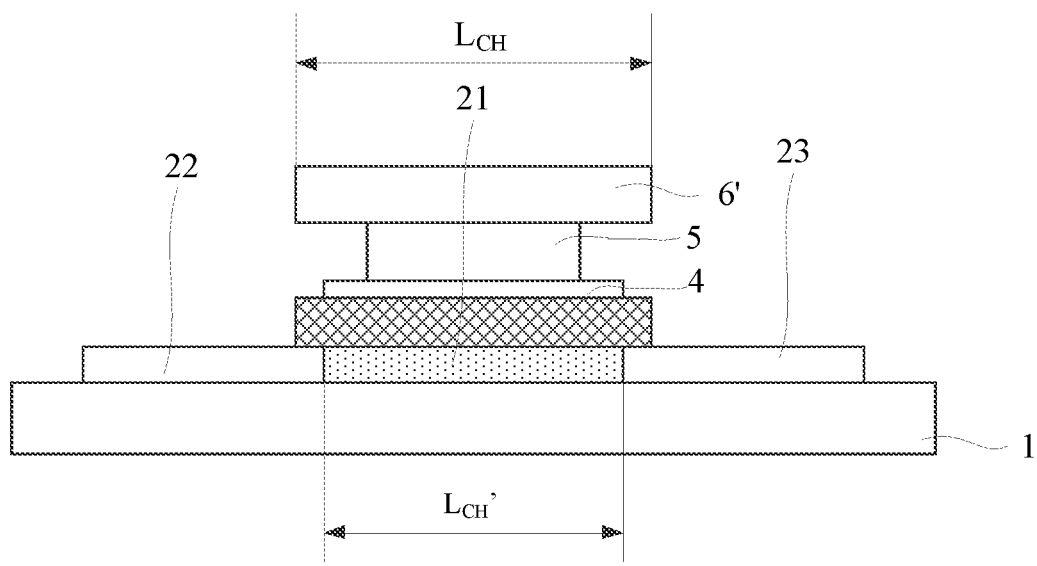

In step S207, referring to FIG. 3G, portions of the active layer 2 on both sides of the gate electrode may be conductorized to form the source region 22 and the drain region 23.

Optionally, the conductorization treatment may include conductorization treatment processes such as plasma treatment, annealing treatment, light treatment or ion doping.

For example, the portions of the active layer 2 on both sides of the gate electrode may be conductorized by using a single gas plasma (for example, helium (He) plasma, argon (Ar) plasma, xenon (Xe) plasma, hydrogen (H) plasma) or mixed gas plasma (for example, mixed gas plasma containing $SF_6$ and $O_2$), that is, portions of the active layer 2 which are not covered by the gate electrode are conductorized to improve a conductivity of the portions of the active layer 2 which are not covered by the gate electrode.

For another example, the portions of the active layer 2 which are not covered by the gate electrode may be conductorized by using a vacuum annealing process, so as to improve the conductivity of the portions of the active layer 2 which are not covered by the gate electrode.

For a further example, the active layer 2, for example, formed of an oxide semiconductor, may be irradiated with a predetermined light source (for example, ultraviolet light), in this case, portions of the active layer 2 which are not covered by the gate electrode are conductorized. Specifically, electrons at a top of a valence band may absorb energy from the predetermined light source to be excited to a conduction band, so that a hole layer is formed at the top of the valence band and an electron layer is formed at a bottom of a conduction band. In this way, the conductivity of the portions of the active layer 2 which are not covered by the gate electrode is improved.

For another further example, the portions of the active layer 2 which are not covered by the gate electrode may be ion-doped to increase the conductivity of the portions of the active layer 2 which are not covered by the gate electrode.

In the embodiments, the conductorization treatments may be used to conductorize the portions of the active layer 2 on both sides of the first gate electrode 4 (i.e., the portions which are not covered by the gate electrode), so that the active layer 2 includes the source region 22, the channel region 21 and the drain region 23, as shown in FIG. 3G, and the conductivity of each of the source region 22 and the drain region 23 subjected to the conductorization treatments is greater than the conductivity of the channel region 21.

Since the length of the first gate electrode 4 is greater than the length of the second gate electrode 5, in this step, the first gate electrode 4 is actually used as a mask to perform the conductorization treatment. The portion, which is not covered by the first gate electrode 4, of the active layer 2 is still a semiconductor, and this portion forms the channel region 21. The portions, which are not covered by the first gate electrode 4, of the active layer 2 are conductorized, so that the source region 22 and the drain region 23 with larger conductivity are formed, respectively.

The etching bias $\Delta L1$ of the first gate electrode 4 is smaller than the etching bias $\Delta L2$ of the second gate electrode 5. For example, the etching bias $\Delta L1$ of the first gate electrode 4 is much smaller than the etching bias $\Delta L2$ of the second gate electrode 5. Since the channel region 21 is actually formed by using the first gate electrode 4 as a mask, there may be the following relationship between the actual length $L_{CH}$ of the formed channel region 21 and the length $L_{CH}$ of the photoresist pattern 6' (that is, the designed length of the channel region):

$$L_{CH}'=L_{CH}-2*\Delta L1,$$

Since the thickness of the first gate material layer 4' is small, the etching bias $\Delta L1$ of the first gate electrode 4 is accordingly small. In this way, the actual length $L_{CH}'$ of the formed channel region 21 may be close to the length $L_{CH}$ of the photoresist pattern 6' (that is, the designed length of the channel region).

According to another example of the present disclosure, the thickness of the first gate material layer 4' is 150 Å, the material of the first gate material layer 4' is ITO, and main components of the first etching solution for etching the first gate material layer 4' may include $HNO_3$, $H_2SO_4$, and $CH_3COOH$; the thickness of the second gate material layer 5' is 5000 Å, the material of the second gate material layer 5' includes Cu, and main components of the second etching solution for etching the second gate material layer 5' may include $H_2O_2$. In this case, the etch bias $\Delta L1$ of the first gate electrode 4 which is formed through the wet etching process is less than 0.5 and the etch bias $\Delta L2$ of the second gate electrode 5 which is formed through the wet etching process is less than 2.5 Thus, the etching bias $\Delta L1$ of the first gate electrode 4 is much smaller than the etching bias $\Delta L2$ of the second gate electrode 5.

Therefore, compared to the method according to the embodiments shown in FIG. 1, in the method according to the embodiments shown in FIGS. 2 and 3A to 3G, the actual length of the formed channel region 21 is significantly increased, thereby alleviating the problem of shortening the channel length. As a result, the threshold voltage may not drift negatively, a reduction of the uniformity of the threshold voltages Vth of the thin film transistors may be avoided, and the display quality of the display panel may be improved. Particularly advantageously, in the embodiments, the channel length of the formed thin film transistor is not significantly reduced, so that it is easy to realize a high-resolution display product.

Moreover, in the method according to the embodiments of the present disclosure, the gate electrode or the first gate electrode is used as a mask to perform the conductorization treatment so as to form the channel region, that is, the channel region is formed by using a gate electrode self-alignment process. As shown in FIG. 3G, an orthographic projection of each of the source region 22 and the drain region 23 on the substrate 1 does not overlap with an orthographic projection of each of the first gate electrode 4 and the second gate electrode 5 on the substrate 1. In this way, an increase in parasitic capacitance is avoided, thereby improving the performance of the thin film transistor.

Optionally, the method of manufacturing a thin film transistor according to other exemplary embodiments of the present disclosure may further include the following steps.

Figure 3H:
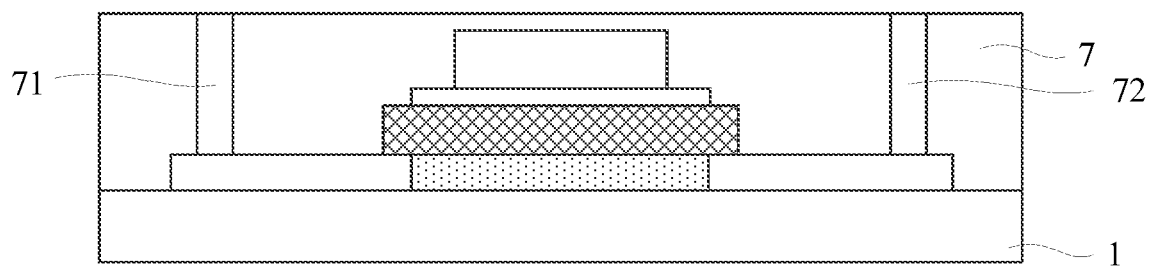

In step S208, referring to FIG. 3H, an interlayer insulating layer 7 covering the active layer 2, the gate insulating layer 3, the gate electrodes 4, 5 may be deposited on the substrate 1, and via holes 71, 72 are formed in the interlayer insulating layer 7.

Figure 3I:
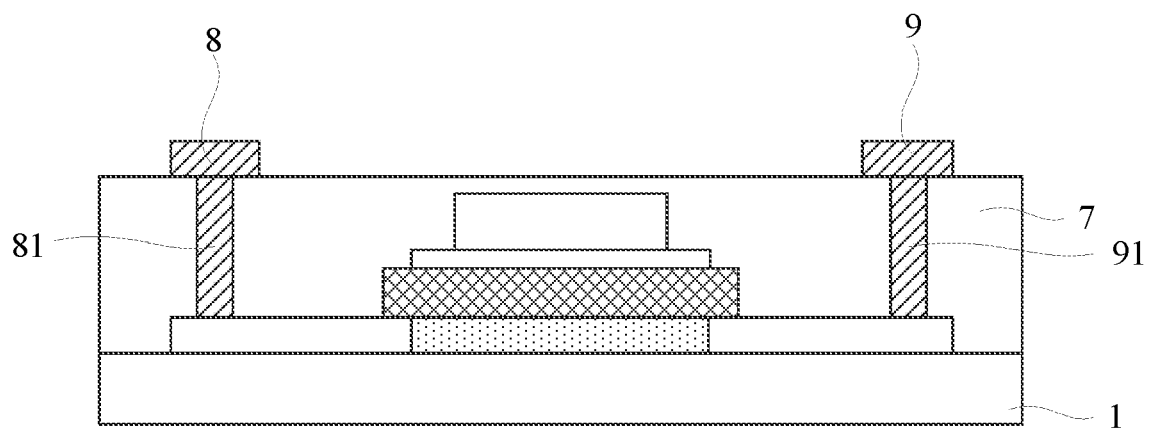

In step S209, referring to FIG. 3I, a source-drain metal layer may be deposited on the substrate 1, so that conductive plugs 81, 91 are respectively formed in the via holes 71, 72 of the interlayer insulating layer 7 and a source electrode 8 and a drain electrode 9 are respectively formed on the interlayer insulating layer 7. As shown in FIG. 3I, the source electrode 8 is electrically connected to the source region 22 through the conductive plug 81, and the drain electrode 9 is electrically connected to the drain region 23 through the conductive plug 91.

Figure 3J:
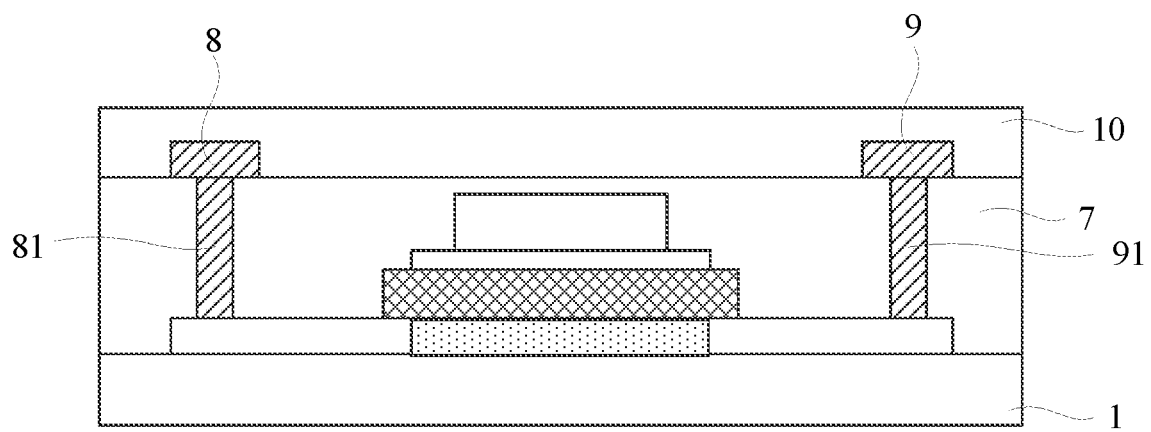

In step S210, referring to FIG. 3J, a passivation layer 10 covering the interlayer insulating layer 7, the source electrode 8 and the drain electrode 9 may be formed on the substrate 1.

Figure 4:
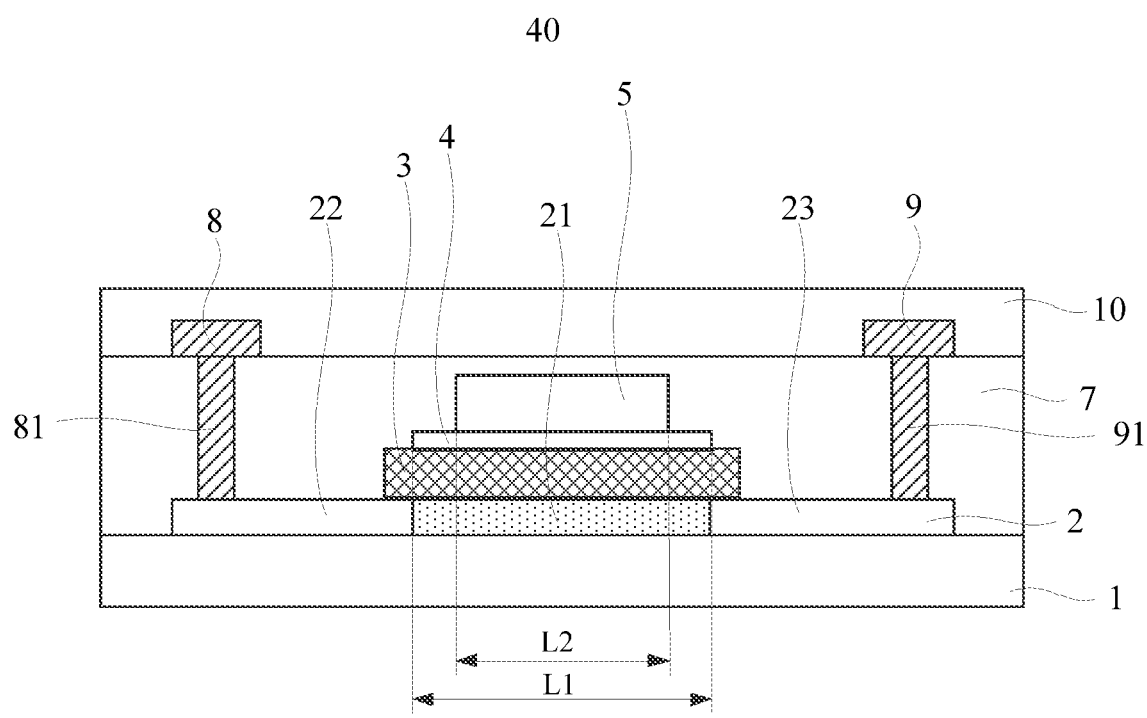
FIG. 4 is a schematic cross-sectional view of a thin film transistor according to some embodiments of the present disclosure.

FIG. 4 is a schematic cross-sectional view of a thin film transistor manufactured by the method shown in FIG. 3A to FIG. 3J. As shown in FIG. 4, the thin film transistor 40 has a structure of a top-gate thin film transistor, which is formed on the substrate 1 and specifically includes: an active layer 2 provided on the substrate 1, the active layer 2 including a source region 22, a drain region 23 and a channel region 21 between the source region 22 and the drain region 23; a gate insulating layer 3 on a side of the active layer 2 away from the substrate 1; a first gate electrode 4 on a side of the gate insulating layer 3 away from the substrate 1; and a second gate electrode 5 on a side of the first gate electrode 4 away from the substrate 1.

As shown in FIG. 4, a thickness of the first gate electrode 4 is smaller than a thickness of the second gate electrode 5. Optionally, the thickness of the first gate electrode 4 may be much smaller than the thickness of the second gate electrode 5, for example, a ratio of the thickness of the first gate electrode 4 to the thickness of the second gate electrode 5 may be in a range of 1/60 ~1/8. Optionally, the thickness of the first gate electrode 4 may be in a range of 150 Å to 1500 Å, such as 150 Å, 200 Å, and the thickness of the second gate electrode 5 may be in a range of 3000 Å to 8000 Å, such as 4000 Å. In the embodiments of the present disclosure, the first gate electrode 4 is mainly used as a shielding layer during the conductorization treatment, for example, it may prevent the plasma in the conductorization treatment from diffusing into the channel region, so the thickness of the first gate electrode 4 may be small, even as small as 150 Å.

It should be noted that the inventor found through research that, if the thickness of the first gate electrode 4 is less than 150 Å, a film of the first gate material layer 4' may be uneven when the first gate material layer 4' is formed on the substrate 1, so the thickness of the first gate electrode 4 needs to be greater than or equal to 150 Å.

The first gate electrode 4 and the second gate electrode 5 may be formed of conductive materials. In one example, the first gate electrode 4 may include a first material which is suitable to be etched with a first etching solution, and the second gate electrode 5 may include a second material which is suitable to be etched with a second etching solution. The second etching solution is different from the first etching solution. For example, the first gate electrode 4 may include a metal oxide conductive material, and the second gate electrode 5 may include a metal conductive material. Specifically, the first gate electrode 4 may include materials such as ITO and IZO, a composition of the first etching solution may include $HNO_3$, $H_2SO_4$ and $CH_3COOH$, the second gate electrode 5 may include materials such as Cu, and a composition of the second etching solution may include $H_2O_2$.

Optionally, the first gate electrode 4 may include a first material which is suitable to be etched with a third etching solution, and the second gate electrode 5 may include a second material which is suitable to be etched with the third etching solution. An etching rate at which the first material is etched with the third etching solution is different from an etching rate at which the second material is etched with the third etching solution. For example, the first gate electrode 4 may include a first metal material, and the second gate electrode 5 may include a second metal material different from the first metal material. Specifically, the first gate electrode 4 may include Al, and the second gate electrode 5 may include Cu. A composition of the third etching solution may include $H_2O_2$, and the third etching solution including $H_2O_2$ Cu has different etching rates on Al and Cu.

Further referring to FIG. 4, a length L1 of the first gate electrode 4 is greater than a length L2 of the second gate electrode 5, that is, an orthographic projection of the first gate electrode 4 on the substrate 1 covers an orthographic projection of the second gate electrode 5 on the substrate 1. In the embodiments of the present disclosure, the etching bias when forming the first gate electrode 4 is smaller than the etching bias when forming the second gate electrode 5, so the length L1 of the first gate electrode 4 is greater than the length L2 of the second gate electrode 5. In this way, when the conductorization treatment is performed with using the gate electrode as a mask, the length of the formed channel region will not be significantly reduced, thereby avoiding problems, such as non-uniform threshold voltages Vth of the thin film transistors, which are caused by the short channel effect.

Further, the orthographic projection of the first gate electrode 4 on the substrate 1 may cover an orthographic projection of the channel region 21 on the substrate 1, for example, the orthographic projection of the first gate electrode 4 on the substrate 1 coincides with the orthographic projection of the channel region 21 on the substrate 1. The orthographic projection of the channel region 21 on the substrate 1 covers the orthographic projection of the second gate electrode 5 on the substrate 1. In the embodiments of the present disclosure, the active layer 2 is conductorized with using the first gate electrode 4 as a mask to form the channel region 21, so that the length of the formed channel region will not be significantly reduced. In this way, various problems caused by the short channel effect may be avoided, and it is helpful to realize high-resolution display products.

As shown in FIG. 4, the second gate electrode 5 is electrically connected to the first gate electrode 4, for example, the second gate electrode 5 directly contacts the first gate electrode 4. More specifically, a surface (upper surface of the first gate electrode 4 shown in FIG. 4) of the first gate electrode 4 close to the second gate electrode 5 is in direct contact with a surface (lower surface of the second gate electrode 5 shown in FIG. 4) of the second gate electrode 5 close to the first gate electrode 4. In this way, the first gate electrode 4 and the second gate electrode 5 are electrically connected.

As shown in FIG. 4, neither the source region 22 nor the drain region 23 overlap with the first gate electrode 4 or the second gate electrode 5, that is, the orthographic projection of each of the first gate electrode 4 and the second gate electrode 5 on the substrate 1 does not overlap with the orthographic projection of each of the source region 22 and the drain region 23 on the substrate 1. In this way, an increase in parasitic capacitance is avoided, thereby improving the performance of the thin film transistor.

The material of the active layer 2 may include an oxide semiconductor material, a polycrystalline silicon semiconductor material (e.g., low-temperature polycrystalline silicon), or an amorphous silicon semiconductor material.

For example, the oxide semiconductor material may include a ZnO-based oxide layer. In this case, the active layer 2 may further contain a group III element such as In or Ga, a group IV element such as Sn, a combination thereof, or other elements. For another example, the active layer 2 may include a Cu oxide layer ($CuBO_2$ layer, $CuAlO_2$ layer, $CuGaO_2$ layer, $CuInO_2$ layer, etc.), a Ni oxide layer, a Ni oxide layer doped with Ti, a ZnO-based oxide layer doped with at least one of group I elements, Group II elements or Group V elements, a ZnO-based oxide layer doped with Ag, a PbS layer, a LaCuOS layer, or a LaCuOSe layer. As an example, the active layer 2 may include indium gallium zinc oxide (IGZO) or indium tin zinc oxide (ITZO).

As shown in FIG. 4, the gate insulating layer 3 is located between the active layer 2 and the first gate electrode 4, and an orthographic projection of the gate insulating layer 3 on the substrate 1 covers the orthographic projection of the channel region 21 on the substrate 1. The gate insulating layer 3 is used to isolate the active layer 2 (especially the channel region 21) from the first gate electrode 4.

For example, as shown in FIG. 4, the source region 22 and the drain region 23 are both coplanar with the channel region 21, but do not overlap with the channel region 21. For another example, the conductivity of any one of the source region 22 and the drain region 23 may be greater than the conductivity of the channel region 21.

Referring to FIG. 4, the thin film transistor 40 may further include an interlayer insulating layer 7 covering the active layer 2, the gate insulating layer 3, the gate electrodes 4, 5; conductive plugs 81, 91 located in the interlayer insulating layer 7; a source electrode 8 and a drain electrode 9 on the interlayer insulating layer 7; and a passivation layer 10 covering the interlayer insulating layer 7, the source electrode 8 and the drain electrode 9.

The source electrode 8 and the drain electrode 9 are connected to the source region 22 and the drain region 23, respectively. By setting the conductivity of any one of the source region 22 and the drain region 23 to be greater than the conductivity of the channel region 21, an ohmic contact ability of each of the source electrode and the drain electrode may be improved.

Figure 5:
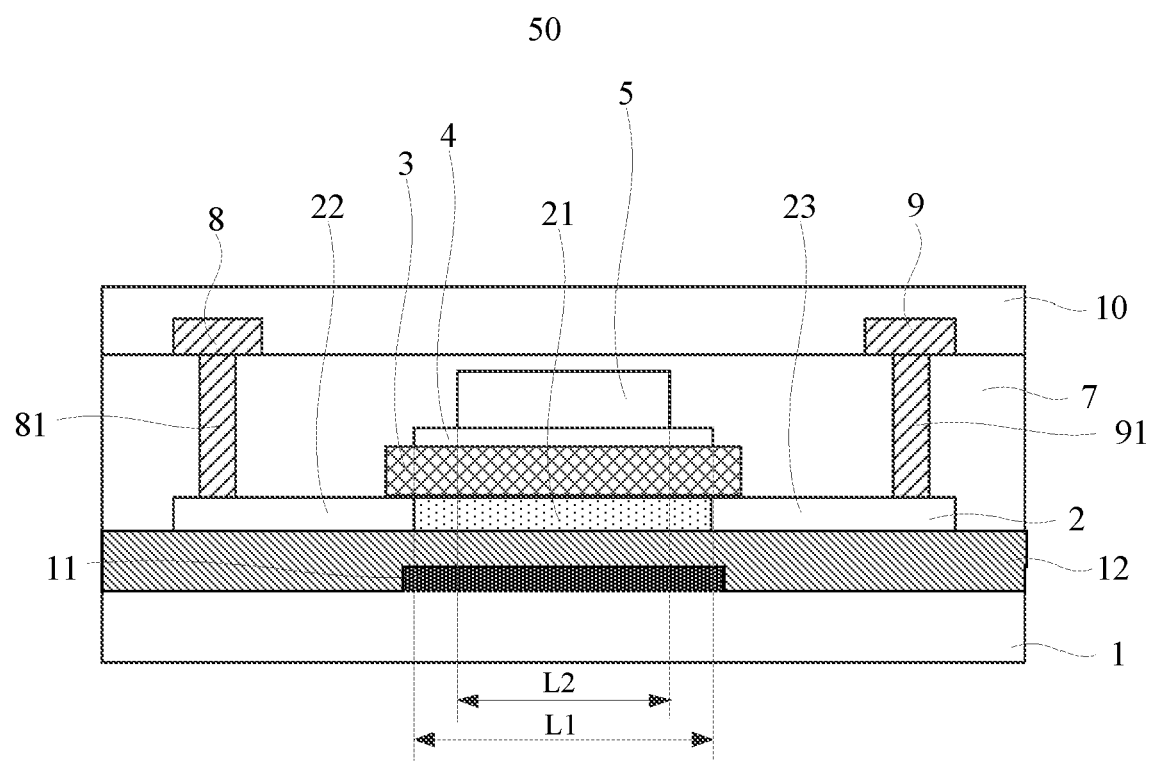
FIG. 5 is a schematic cross-sectional view of a thin film transistor according to other embodiments of the present disclosure.

FIG. 5 is a schematic cross-sectional view of a thin film transistor according to other exemplary embodiments of the present disclosure. The thin film transistor shown in FIG. 5 has substantially the same structure as the thin film transistor shown in FIG. 4, and differences therebetween will be mainly described below.

As shown in FIG. 5, the thin film transistor 50 is formed on the substrate 1 and specifically includes: a light shielding layer 11 provided on the substrate 1; a third insulating layer 12 provided on the substrate 1 and covering the light shielding layer 11; an active layer 2 on a side of the third insulating layer 12 away from the substrate 1, the active layer 2 including a source region 22, a drain region 23, and a channel region 21 between the source region 22 and the drain region 23; a gate insulating layer 3 on a side of the active layer 2 away from the substrate 1; a first gate electrode 4 on a side of the gate insulating layer 3 away from the substrate 1; and a second gate electrode 5 on a side of the first electrode 4 away from the substrate 1.

For example, the light shielding layer 11 may be made of a metal material, such as Mo, Al, etc., or may be made of an inorganic material.

As shown in FIG. 5, an orthographic projection of the light shielding layer 11 on the substrate 1 may completely cover an orthographic projection of the channel region 21 on the substrate 1. By providing the light shielding layer, the channel region may be protected from backlight or other ambient light, and the stability of the thin film transistor may be improved.

Figure 6:
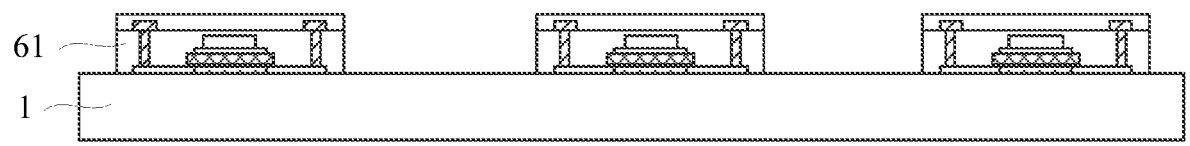
FIG. 6 is a schematic structural view of an array substrate according to some embodiments of the present disclosure.

Optionally, embodiments of the present disclosure further provide an array substrate. For example, as shown in FIG. 6, the array substrate 60 includes a substrate 1 and a plurality of thin film transistors 61 provided on the substrate 1. At least one of the plurality of thin film transistors 61 may be the thin film transistor described in any of the above embodiments.

Figure 7:
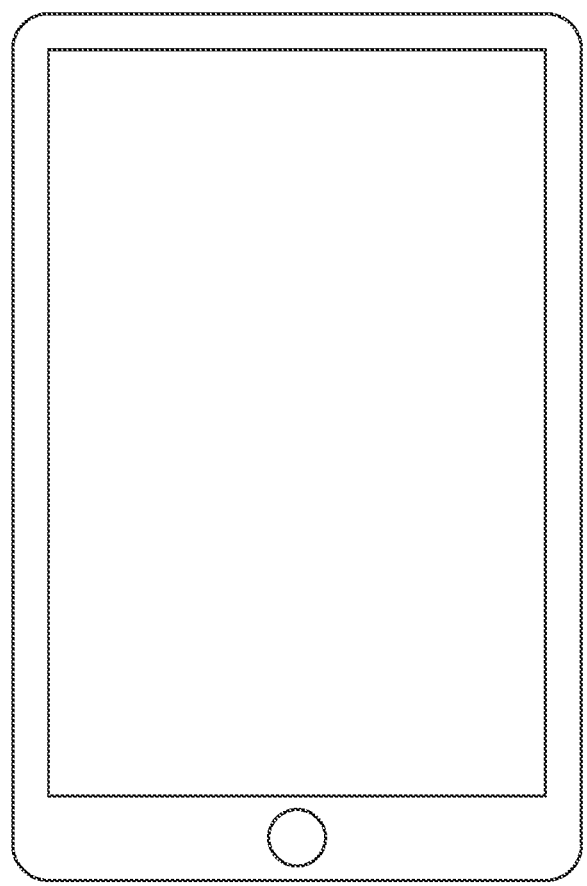
FIG. 7 is a schematic structural view of a display device according to some embodiments of the present disclosure.

Optionally, embodiments of the present disclosure further provide a display device, which may include the above-mentioned array substrate, and the above-mentioned array substrate further includes any one of the above-mentioned thin film transistors. The display device may include, but is not limited to, any product or component with a display function, such as an electronic paper, a mobile phone, a tablet computer, a television, a display, a notebook computer, a digital photo frame, a navigator, and the like. It should be understood that the display device has the same beneficial effects as the thin film transistor provided by the foregoing embodiments. As shown in FIG. 7, an example in which the display device is a smartphone is schematically shown.

Although some embodiments according to the general inventive concept of the present disclosure have been illustrated and described, those skilled in the art will understand that these embodiments may be changed without departing from the principle and spirit of the general inventive concept of the present disclosure. Therefore, the scope of the present disclosure shall be defined by claims and their equivalents.

What is claimed is:

1. A thin film transistor, wherein the thin film transistor is formed on a substrate, and the thin film transistor is an oxide thin film transistor and comprises:
    an active layer on the substrate, the active layer comprising a source region, a drain region, and a channel region between the source region and the drain region, and a material of the active layer comprising an oxide semiconductor material;
    a gate insulating layer on a side of the active layer away from the substrate, an orthographic projection of the gate insulating layer on the substrate partially overlaps with an orthographic projection of the active layer on the substrate;
    a first gate electrode on a side of the gate insulating layer away from the substrate, and configured to mask the active layer when performing a conductorization treatment on the active layer, so that an orthographic projection of the first gate electrode on the substrate completely coincides with an orthographic projection of the channel region on the substrate;
    a second gate electrode on a side of the first gate electrode away from the substrate; and
    an interlayer insulating layer covering the active layer, the gate insulating layer, and the first gate electrode, and the second gate electrode deposited on the substrate,
    wherein a thickness of the first gate electrode is smaller than a thickness of the second gate electrode, and
    a ratio of the thickness of the first gate electrode to the thickness of the second gate electrode is in a range of $1/60$ to $3/160$,
    wherein a length of the first gate electrode is greater than a length of the second gate electrode.

2. The thin film transistor according to claim 1, wherein an orthographic projection of the first gate electrode on the substrate covers an orthographic projection of the second gate electrode on the substrate.

3. The thin film transistor according to claim 1, wherein an orthographic projection of any one of the first gate electrode and the second gate electrode on the substrate does not overlap with an orthographic projection of any one of the source region and the drain region on the substrate.

4. The thin film transistor according to claim 1, wherein a surface of the first gate electrode close to the second gate electrode is in direct contact with a surface of the second gate electrode close to the first gate electrode.

5. The thin film transistor according to claim 1, wherein the first gate electrode comprises a first material which is suitable to be etched with a first etching solution, the second gate electrode comprises a second material which is suitable to be etched with a second etching solution, and the first etching solution is different from the second etching solution; or,
    wherein the first gate electrode comprises a first material which is suitable to be etched with a third etching solution, the second gate electrode comprises a second material which is suitable to be etched with the third etching solution, and an etching rate, at which the first material is etched with the third etching solution, is different from an etching rate, at which the second material is etched with the third etching solution.

6. The thin film transistor according to claim 5, wherein the first gate electrode comprises a metal oxide conductive material, and the second gate electrode comprises a metal conductive material; or,
wherein the first gate electrode comprises a first metal material, and the second gate electrode comprises a second metal material different from the first metal material.

7. The thin film transistor according to claim 1, wherein the thickness of the first gate electrode is in a range of 150 Å to 1500 Å.

8. The thin film transistor according to claim 1, wherein a conductivity of any one of the source region and the drain region is greater than a conductivity of the channel region.

9. The thin film transistor according to claim 1, further comprising: a light shielding layer between the substrate and the active layer, wherein an orthographic projection of the light shielding layer on the substrate covers an orthographic projection of the channel region on the substrate.

10. An array substrate comprising the thin film transistor according to claim 1.

11. A display device comprising the array substrate according to claim 10.

12. A method of manufacturing a thin film transistor, the thin film transistor being an oxide thin film transistor, the method comprising:
forming an active layer on a substrate, wherein a material of the active layer comprises an oxide semiconductor material;
forming a first insulating material layer on the substrate;
forming a first gate material layer and a second gate material layer in sequence on the substrate, a thickness of the first gate material layer being smaller than a thickness of the second gate material layer, a ratio of the thickness of the first gate material layer to the thickness of the second gate material layer being in a range of 1/60 to 3/160;
performing a patterning process on the first gate material layer and the second gate material layer to form a first gate electrode and a second gate electrode, respectively, a length of the first gate electrode being greater than a length of the second gate electrode;
performing a patterning process on the first insulating material layer to form a gate insulating layer, so that an orthographic projection of the gate insulating layer on the substrate partially overlaps with an orthographic projection of the active layer on the substrate;
performing a conductorization treatment on the active layer with using the first gate electrode as a mask, so that the active layer comprises a source region, a drain region, and a channel region between the source region and the drain region, and an orthographic projection of the first gate electrode on the substrate completely coincides with an orthographic projection of the channel region on the substrate
an interlayer insulating layer covering the active layer, the gate insulating layer, and the first gate electrode, and the second gate electrode on the substrate.

13. The method according to claim 12, wherein the step of performing a patterning process on the first gate material layer and the second gate material layer to form a first gate electrode and a second gate electrode, respectively, comprises:
forming a photoresist layer on the second gate material layer;
forming a photoresist pattern through exposure and development processes;
etching the second gate material layer with a second etching solution to form the second gate electrode; and
etching the first gate material layer with a first etching solution different from the second etching solution, to form the first gate electrode.

14. The method according to claim 12, wherein the step of performing a patterning process on the first gate material layer and the second gate material layer to form a first gate electrode and a second gate electrode, respectively, comprises:
forming a photoresist layer on the second gate material layer;
forming a photoresist pattern through exposure and development processes; and
etching both the second gate material layer and the first gate material layer with a third etching solution to form the first gate electrode and the second gate electrode, wherein an etching rate, at which the first gate material layer is etched with the third etching solution, is different from an etching rate, at which the second gate material layer is etched with the third etching solution.

15. The method according to claim 12, wherein an orthographic projection of the first gate electrode on the substrate covers an orthographic projection of the second gate electrode on the substrate.

16. The method according to claim 15, wherein, the step of performing a conductorization treatment on the active layer with using the first gate electrode as a mask so that the active layer comprises a source region, a drain region, and a channel region between the source region and the drain region comprises:
performing the conductorization treatment on portions of the active layer which are not covered by the first gate electrode, so that the portions of the active layer which are not covered by the first gate electrode form the source region and the drain region, respectively, and a portion of the active layer which is covered by the first gate electrode forms the channel region.

* * * * *